United States Patent
Navratil et al.

(10) Patent No.: US 7,368,925 B2
(45) Date of Patent: *May 6, 2008

(54) PROBE STATION WITH TWO PLATENS

(75) Inventors: Peter Navratil, Tualatin, OR (US); Brad Froemke, Portland, OR (US); Craig Stewart, Bloxham (GB); Anthony Lord, Banbury (GB); Jeff Spencer, Vernonia, OR (US); Scott Runbaugh, Tigard, OR (US); Gavin Fisher, Chinnor (GB); Pete McCann, Beaverton, OR (US); Rod Jones, Gaston, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/759,481

(22) Filed: Jan. 16, 2004

(65) Prior Publication Data
US 2005/0156610 A1    Jul. 21, 2005

Related U.S. Application Data

(63) Continuation of application No. 10/285,135, filed on Oct. 30, 2002, now Pat. No. 6,777,964.

(60) Provisional application No. 60/351,844, filed on Jan. 25, 2002.

(51) Int. Cl.
*G01R 31/02*    (2006.01)

(52) U.S. Cl. .................... 324/754; 324/753; 324/761; 324/762

(58) Field of Classification Search ................ 324/750, 324/752, 754–755, 761–762, 765, 158.1
See application file for complete search history.

(56) References Cited

U.S. PATENT DOCUMENTS

| | | | |
|---|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |

(Continued)

FOREIGN PATENT DOCUMENTS

CN    1083975    3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Componets Letters, vol. 13, No. 7, Jul. 2003, pp. 262-264.

(Continued)

*Primary Examiner*—Minh N. Tang
(74) *Attorney, Agent, or Firm*—Chernoff, Vilhauer, McClung & Stenzel

(57) ABSTRACT

A probe station for testing a device under test. A first platen supporting an electrical probe. A chuck supporting the device under test. A second platen supporting an optical probe. The first platen and the second platen positioned above the device under test. A percentage of the top surface of the second platen terminating into free space.

10 Claims, 8 Drawing Sheets

U.S. PATENT DOCUMENTS

| | | |
|---|---|---|
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A * | 3/1986 | Palkuti ...................... 324/750 |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,706,019 A * | 11/1987 | Richardson ................. 324/751 |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |

| Patent | Date | Inventor |
|---|---|---|
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,831,494 A | 5/1989 | Arnold et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,853,624 A | 8/1989 | Rabjohn |
| 4,853,627 A | 8/1989 | Gleason et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,864,227 A | 9/1989 | Sato |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,918,383 A | 4/1990 | Huff et al. |
| 4,922,128 A | 5/1990 | Dhong et al. |
| 4,922,186 A | 5/1990 | Tsuchiya et al. |
| 4,923,407 A | 5/1990 | Rice et al. |
| 4,926,118 A | 5/1990 | O'Connor et al. |
| 4,929,893 A | 5/1990 | Sato et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,082,627 A | 1/1992 | Stanbro |
| 5,084,671 A | 1/1992 | Miyata et al. |
| 5,089,774 A | 2/1992 | Nakano |
| 5,091,691 A | 2/1992 | Kamieniecki et al. |
| 5,091,732 A | 2/1992 | Mileski et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,136,237 A | 8/1992 | Smith et al. |
| 5,142,224 A | 8/1992 | Smith et al. |
| 5,144,228 A | 9/1992 | Sorna et al. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,164,661 A | 11/1992 | Jones |
| 5,166,606 A | 11/1992 | Blanz |
| 5,172,049 A | 12/1992 | Kiyokawa et al. |
| 5,172,051 A | 12/1992 | Zamborelli |
| 5,187,443 A | 2/1993 | Bereskin |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,209,088 A | 5/1993 | Vaks |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,227,730 A | 7/1993 | King et al. |
| 5,232,789 A | 8/1993 | Platz et al. |
| 5,233,197 A | 8/1993 | Bowman et al. |
| 5,233,306 A | 8/1993 | Misra |
| 5,237,267 A | 8/1993 | Harwood et al. |
| 5,245,292 A | 9/1993 | Milesky et al. |
| 5,266,889 A | 11/1993 | Harwood et al. |
| 5,267,088 A | 11/1993 | Nomura |
| 5,270,664 A | 12/1993 | McMurtry et al. |
| 5,274,336 A | 12/1993 | Crook et al. |
| 5,278,494 A | 1/1994 | Obigane |
| 5,280,156 A | 1/1994 | Niori et al. |
| 5,298,972 A | 3/1994 | Heffner |
| 5,303,938 A | 4/1994 | Miller et al. |
| 5,304,924 A | 4/1994 | Yamano et al. |
| 5,315,237 A | 5/1994 | Iwakura et al. |
| 5,321,352 A | 6/1994 | Takebuchi |
| 5,321,453 A | 6/1994 | Mori et al. |
| 5,325,052 A | 6/1994 | Yamashita |
| 5,334,931 A | 8/1994 | Clarke et al. |
| 5,336,989 A | 8/1994 | Hofer |
| 5,345,170 A * | 9/1994 | Schwindt et al. ............ 324/754 |
| 5,357,211 A | 10/1994 | Bryson et al. |
| 5,363,050 A | 11/1994 | Guo et al. |
| 5,369,368 A | 11/1994 | Kassen et al. |
| 5,369,370 A | 11/1994 | Stratmann et al. |
| 5,371,457 A | 12/1994 | Lipp |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,397,855 A | 3/1995 | Ferlier |
| 5,404,111 A | 4/1995 | Mori et al. |

| Patent | Date | Name |
|---|---|---|
| 5,408,188 A | 4/1995 | Katoh |
| 5,408,189 A | 4/1995 | Swart et al. |
| 5,410,259 A * | 4/1995 | Fujihara et al. ............ 324/758 |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Bruce et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A * | 5/1997 | Spaziani et al. ............ 324/752 |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishaway et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A * | 11/1998 | Yassine ................ 324/754 |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |

| | | | | | | |
|---|---|---|---|---|---|---|
| 5,949,579 | A | 9/1999 | Baker | 6,184,845 B1 | 2/2001 | Leisten et al. |
| 5,952,842 | A | 9/1999 | Fujimoto | 6,191,596 B1 | 2/2001 | Abiko |
| 5,959,461 | A | 9/1999 | Brown et al. | 6,194,720 B1 | 2/2001 | Li et al. |
| 5,960,411 | A | 9/1999 | Hartman et al. | 6,194,907 B1 | 2/2001 | Kanao et al. |
| 5,963,027 | A | 10/1999 | Peters | 6,198,299 B1 | 3/2001 | Hollman |
| 5,963,364 | A | 10/1999 | Leong et al. | 6,211,663 B1 | 4/2001 | Moulthrop et al. |
| 5,970,429 | A | 10/1999 | Martin | 6,211,837 B1 | 4/2001 | Crouch et al. |
| 5,973,505 | A | 10/1999 | Strid et al. | 6,215,295 B1 | 4/2001 | Smith, III |
| 5,974,662 | A | 11/1999 | Eldridge et al. | 6,222,031 B1 | 4/2001 | Wakabayashi et al. |
| 5,981,268 | A | 11/1999 | Kovacs et al. | 6,222,970 B1 | 4/2001 | Wach et al. |
| 5,982,166 | A | 11/1999 | Mautz | 6,229,327 B1 | 5/2001 | Boll et al. |
| 5,993,611 | A | 11/1999 | Moroney, III et al. | 6,232,787 B1 | 5/2001 | Lo et al. |
| 5,995,914 | A | 11/1999 | Cabot | 6,232,788 B1 | 5/2001 | Schwindt et al. |
| 5,996,102 | A | 11/1999 | Haulin | 6,232,789 B1 | 5/2001 | Schwindt |
| 5,998,768 | A | 12/1999 | Hunter et al. | 6,232,790 B1 | 5/2001 | Bryan et al. |
| 5,999,268 | A | 12/1999 | Yonezawa et al. | 6,233,613 B1 | 5/2001 | Walker et al. |
| 6,001,760 | A | 12/1999 | Katsuda et al. | 6,236,223 B1 | 5/2001 | Brady et al. |
| 6,002,236 | A | 12/1999 | Trant et al. | 6,236,975 B1 | 5/2001 | Boe et al. |
| 6,002,263 | A | 12/1999 | Peters et al. | 6,236,977 B1 | 5/2001 | Verba et al. |
| 6,002,426 | A | 12/1999 | Back et al. | 6,242,929 B1 | 6/2001 | Mizuta |
| 6,013,586 | A | 1/2000 | McGhee et al. | 6,245,692 B1 | 6/2001 | Pearce et al. |
| 6,019,612 | A | 2/2000 | Hasegawa et al. | 6,251,595 B1 | 6/2001 | Gordon et al. |
| 6,023,209 | A | 2/2000 | Faulkner et al. | 6,252,392 B1 | 6/2001 | Peters |
| 6,028,435 | A | 2/2000 | Nikawa | 6,257,319 B1 | 7/2001 | Kainuma et al. |
| 6,029,141 | A | 2/2000 | Bezos et al. | 6,257,564 B1 | 7/2001 | Avneri et al. |
| 6,031,383 | A | 2/2000 | Streib et al. | 6,259,261 B1 | 7/2001 | Engelking et al. |
| 6,032,714 | A | 3/2000 | Fenton | 6,265,950 B1 | 7/2001 | Schmidt et al. |
| 6,034,533 | A | 3/2000 | Tervo et al. | 6,271,673 B1 | 8/2001 | Furuta et al. |
| 6,037,785 | A | 3/2000 | Higgins | 6,275,738 B1 | 8/2001 | Kasevich et al. |
| 6,037,793 | A | 3/2000 | Miyazawa et al. | 6,278,051 B1 | 8/2001 | Peabody |
| 6,043,667 | A | 3/2000 | Cadwallader et al. | 6,278,411 B1 | 8/2001 | Ohlsson et al. |
| 6,049,216 | A | 4/2000 | Yang et al. | 6,281,691 B1 | 8/2001 | Matsunaga et al. |
| 6,051,422 | A | 4/2000 | Kovacs et al. | 6,284,971 B1 | 9/2001 | Atalar et al. |
| 6,052,653 | A | 4/2000 | Mazur et al. | 6,288,557 B1 | 9/2001 | Peters et al. |
| 6,054,869 | A | 4/2000 | Hutton et al. | 6,292,760 B1 | 9/2001 | Burns |
| 6,060,888 | A | 5/2000 | Blackham et al. | 6,300,775 B1 | 10/2001 | Peach et al. |
| 6,060,891 | A | 5/2000 | Hembree et al. | 6,307,672 B1 | 10/2001 | DeNure |
| 6,060,892 | A | 5/2000 | Yamagata | 6,310,483 B1 | 10/2001 | Taura et al. |
| 6,061,589 | A | 5/2000 | Bridges et al. | 6,310,755 B1 | 10/2001 | Kholodenko et al. |
| 6,064,213 | A | 5/2000 | Khandros et al. | 6,313,649 B2 | 11/2001 | Harwood et al. |
| 6,064,217 | A | 5/2000 | Smith | 6,320,372 B1 | 11/2001 | Keller |
| 6,064,218 | A | 5/2000 | Godfrey et al. | 6,320,396 B1 | 11/2001 | Nikawa |
| 6,066,911 | A | 5/2000 | Lindemann et al. | 6,327,034 B1 | 12/2001 | Hoover et al. |
| 6,078,183 | A | 6/2000 | Cole, Jr. | 6,335,625 B1 | 1/2002 | Bryant et al. |
| 6,091,236 | A | 7/2000 | Piety et al. | 6,335,628 B2 | 1/2002 | Schwindt et al. |
| 6,091,255 | A | 7/2000 | Godfrey | 6,340,568 B2 | 1/2002 | Hefti |
| 6,096,567 | A * | 8/2000 | Kaplan et al. ............... 438/14 | 6,340,895 B1 | 1/2002 | Gervais |
| 6,100,815 | A | 8/2000 | Pailthorp | 6,359,456 B1 | 3/2002 | Hembree et al. |
| 6,104,203 | A | 8/2000 | Costello et al. | 6,362,636 B1 | 3/2002 | Peters et al. |
| 6,104,206 | A | 8/2000 | Verkuil | 6,362,792 B1 | 3/2002 | Sawamura et al. |
| 6,111,419 | A | 8/2000 | Lefever et al. | 6,366,247 B1 | 4/2002 | Sawamura et al. |
| 6,114,865 | A | 9/2000 | Lagowski et al. | 6,369,776 B1 | 4/2002 | Leisten et al. |
| 6,118,287 | A | 9/2000 | Boll et al. | 6,376,258 B2 | 4/2002 | Hefti |
| 6,118,894 | A | 9/2000 | Schwartz et al. | 6,380,751 B2 | 4/2002 | Harwood et al. |
| 6,121,783 | A | 9/2000 | Horner et al. | 6,384,614 B1 | 5/2002 | Hager et al. |
| 6,124,723 | A | 9/2000 | Costello | 6,395,480 B1 | 5/2002 | Hefti |
| 6,124,725 | A | 9/2000 | Sato | 6,396,296 B1 | 5/2002 | Tarter et al. |
| 6,127,831 | A | 10/2000 | Khoury et al. | 6,396,298 B1 | 5/2002 | Young et al. |
| 6,130,544 | A | 10/2000 | Strid et al. | 6,400,168 B2 | 6/2002 | Matsunaga et al. |
| 6,137,302 | A | 10/2000 | Schwindt | 6,404,213 B2 | 6/2002 | Noda |
| 6,137,303 | A | 10/2000 | Deckert et al. | 6,407,560 B1 | 6/2002 | Walraven et al. |
| 6,144,212 | A | 11/2000 | Mizuta | 6,407,562 B1 | 6/2002 | Whiteman |
| 6,147,502 | A | 11/2000 | Fryer et al. | 6,409,724 B1 | 6/2002 | Penny et al. |
| 6,147,851 | A | 11/2000 | Anderson | 6,414,478 B1 | 7/2002 | Suzuki |
| 6,160,407 | A | 12/2000 | Nikawa | 6,415,858 B1 | 7/2002 | Getchel et al. |
| 6,166,553 | A | 12/2000 | Sinsheimer | 6,418,009 B1 | 7/2002 | Brunette |
| 6,169,410 | B1 | 1/2001 | Grace et al. | 6,420,722 B2 | 7/2002 | Moore et al. |
| 6,172,337 | B1 | 1/2001 | Johnsgard et al. | 6,424,141 B1 | 7/2002 | Hollman et al. |
| 6,175,228 | B1 | 1/2001 | Zamborelli et al. | 6,424,316 B1 | 7/2002 | Leisten |
| 6,181,144 | B1 | 1/2001 | Hembree et al. | 6,445,202 B1 | 9/2002 | Cowan et al. |
| 6,181,149 | B1 | 1/2001 | Godfrey et al. | 6,447,339 B1 | 9/2002 | Reed et al. |
| 6,181,297 | B1 | 1/2001 | Leisten | 6,448,788 B1 | 9/2002 | Meaney et al. |
| 6,181,416 | B1 | 1/2001 | Falk | 6,459,739 B1 | 10/2002 | Vitenberg |

| Patent | Date | Name |
|---|---|---|
| 6,476,442 B1 | 11/2002 | Williams et al. |
| 6,480,013 B1 | 11/2002 | Nayler et al. |
| 6,481,939 B1 | 11/2002 | Gillespie et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,492,822 B2 | 12/2002 | Schwindt et al. |
| 6,501,289 B1 | 12/2002 | Takekoshi |
| 6,512,482 B1 | 1/2003 | Nelson et al. |
| 6,515,494 B1 * | 2/2003 | Low .................... 324/752 |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | Dibattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,653,903 B2 | 11/2003 | Leich et al. |
| 6,657,601 B2 | 12/2003 | McLean |
| 6,686,753 B1 * | 2/2004 | Kitahata .................... 324/754 |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Chugo et al. |
| 6,734,687 B1 * | 5/2004 | Ishitani et al. .............. 324/751 |
| 6,737,920 B2 | 5/2004 | Jen et al. |
| 6,744,268 B2 | 6/2004 | Hollman |
| 6,753,679 B1 | 6/2004 | Kwong et al. |
| 6,753,699 B2 | 6/2004 | Stockstad |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 * | 8/2004 | Hembree .................... 324/758 |
| 6,777,964 B2 * | 8/2004 | Navratil et al. ............. 324/754 |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,927,079 B1 * | 8/2005 | Fyfield .................... 438/14 |
| 6,937,341 B1 | 8/2005 | Woollam et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |

| | | | | | | |
|---|---|---|---|---|---|---|
| 7,030,827 B2 | 4/2006 | Mahler et al. | | 2004/0175294 A1 | 9/2004 | Ellison et al. |
| 7,032,307 B2 | 4/2006 | Matsunaga et al. | | 2004/0186382 A1 | 9/2004 | Modell et al. |
| 7,034,553 B2 | 4/2006 | Gilboe | | 2004/0193382 A1 | 9/2004 | Adamian et al. |
| 7,035,738 B2 | 4/2006 | Matsumoto et al. | | 2004/0197771 A1 | 10/2004 | Powers et al. |
| 7,088,981 B2 | 8/2006 | Chang | | 2004/0199350 A1 | 10/2004 | Blackham et al. |
| 7,096,133 B1 | 8/2006 | Martin et al. | | 2004/0207072 A1 | 10/2004 | Hiramatsu et al. |
| 7,101,797 B2 | 9/2006 | Yuasa | | 2004/0207424 A1 | 10/2004 | Hollman |
| 7,187,188 B2 | 3/2007 | Andrews et al. | | 2004/0239338 A1 | 12/2004 | Johnsson et al. |
| 7,188,037 B2 | 3/2007 | Hidehira | | 2004/0246004 A1 | 12/2004 | Heuermann |
| 2001/0002794 A1 | 6/2001 | Draving et al. | | 2004/0251922 A1 | 12/2004 | Martens et al. |
| 2001/0009377 A1 | 7/2001 | Schwindt et al. | | 2005/0024069 A1 | 2/2005 | Hayden et al. |
| 2001/0010468 A1 | 8/2001 | Gleason et al. | | 2005/0026276 A1 | 2/2005 | Chou |
| 2001/0020283 A1 | 9/2001 | Sakaguchi | | 2005/0030047 A1 | 2/2005 | Adamian |
| 2001/0024116 A1 | 9/2001 | Draving | | 2005/0054029 A1 | 3/2005 | Tomimatsu et al. |
| 2001/0030549 A1 | 10/2001 | Gleason et al. | | 2005/0062533 A1 | 3/2005 | Vice |
| 2001/0043073 A1 | 11/2001 | Montoya | | 2005/0083130 A1 | 4/2005 | Grilo |
| 2001/0044152 A1 | 11/2001 | Burnett | | 2005/0099192 A1 | 5/2005 | Dunklee et al. |
| 2001/0045511 A1 | 11/2001 | Moore et al. | | 2005/0101846 A1 | 5/2005 | Fine et al. |
| 2001/0054906 A1 | 12/2001 | Fujimura | | 2005/0156675 A1 | 7/2005 | Rohde et al. |
| 2002/0005728 A1 | 1/2002 | Babson et al. | | 2005/0164160 A1 | 7/2005 | Gunter et al. |
| 2002/0008533 A1 | 1/2002 | Ito et al. | | 2005/0165316 A1 | 7/2005 | Lowery et al. |
| 2002/0009377 A1 | 1/2002 | Shafer | | 2005/0168722 A1 | 8/2005 | Forstner et al. |
| 2002/0009378 A1 | 1/2002 | Obara | | 2005/0174191 A1 | 8/2005 | Brunker et al. |
| 2002/0011859 A1 | 1/2002 | Smith et al. | | 2005/0178980 A1 | 8/2005 | Skidmore et al. |
| 2002/0011863 A1 | 1/2002 | Takahashi et al. | | 2005/0195124 A1 | 9/2005 | Puente Ballarda et al. |
| 2002/0050828 A1 | 5/2002 | Seward, IV et al. | | 2005/0227503 A1 | 10/2005 | Reitinger |
| 2002/0070743 A1 | 6/2002 | Felici et al. | | 2005/0236587 A1 | 10/2005 | Kodama et al. |
| 2002/0070745 A1 | 6/2002 | Johnson et al. | | 2005/0237102 A1 | 10/2005 | Tanaka |
| 2002/0075027 A1 | 6/2002 | Hollman et al. | | 2006/0052075 A1 | 3/2006 | Galivanche et al. |
| 2002/0079911 A1 | 6/2002 | Schwindt | | 2006/0114012 A1 | 6/2006 | Reitinger |
| 2002/0118009 A1 | 8/2002 | Hollman et al. | | 2006/0155270 A1 | 7/2006 | Hancock et al. |
| 2002/0118034 A1 | 8/2002 | Laureantl | | 2006/0158207 A1 | 7/2006 | Reitinger |
| 2002/0149377 A1 | 10/2002 | Hefti et al. | | 2006/0226864 A1 | 10/2006 | Kramer |
| 2002/0153909 A1 | 10/2002 | Petersen et al. | | 2007/0024506 A1 | 2/2007 | Hardacker |
| 2002/0163769 A1 | 11/2002 | Brown | | 2007/0030021 A1 | 2/2007 | Cowan et al. |
| 2002/0168659 A1 | 11/2002 | Hefti et al. | | | | |
| 2002/0180466 A1 | 12/2002 | Hiramatsu et al. | | | FOREIGN PATENT DOCUMENTS | |
| 2002/0197709 A1 | 12/2002 | Van der Weide et al. | | DE | 31 14 466 | 3/1982 |
| 2003/0010877 A1 | 1/2003 | Landreville et al. | | DE | 31 25 552 | 11/1982 |
| 2003/0030822 A1 | 2/2003 | Finarov | | DE | 3637549 | 5/1988 |
| 2003/0032000 A1 | 2/2003 | Liu et al. | | DE | 41 09 908 | 10/1992 |
| 2003/0040004 A1 | 2/2003 | Hefti et al. | | DE | 43 16 111 | 11/1994 |
| 2003/0057513 A1 | 3/2003 | Alexander | | DE | 195 41 334 | 9/1996 |
| 2003/0062915 A1 | 4/2003 | Arnold et al. | | DE | 196 16 212 | 10/1996 |
| 2003/0071631 A1 | 4/2003 | Alexander | | DE | 19522774 | 1/1997 |
| 2003/0072549 A1 | 4/2003 | Facer et al. | | DE | 196 18 717 | 1/1998 |
| 2003/0077649 A1 | 4/2003 | Cho et al. | | DE | 10000324 | 7/2001 |
| 2003/0088180 A1 | 5/2003 | VanVeen et al. | | EP | 0 087 497 | 9/1983 |
| 2003/0119057 A1 | 6/2003 | Gascoyne et al. | | EP | 0 201 205 | 12/1986 |
| 2003/0139662 A1 | 7/2003 | Seidman | | EP | 0 314 481 | 5/1989 |
| 2003/0139790 A1 | 7/2003 | Ingle et al. | | EP | 0 333 521 | 9/1989 |
| 2003/0141861 A1 | 7/2003 | Navratil et al. | | EP | 0 460 911 | 12/1991 |
| 2003/0155939 A1 | 8/2003 | Lutz et al. | | EP | 0 574 149 A1 | 5/1993 |
| 2003/0170898 A1 | 9/2003 | Gunderson et al. | | EP | 0 574 149 | 12/1993 |
| 2003/0184332 A1 | 10/2003 | Tomimatsu et al. | | EP | 0 706 210 | 4/1996 |
| 2004/0015060 A1 | 1/2004 | Samsoondar et al. | | EP | 0 573 183 | 1/1999 |
| 2004/0021475 A1 | 2/2004 | Ito et al. | | EP | 0 945 736 | 9/1999 |
| 2004/0061514 A1 | 4/2004 | Schwindt et al. | | GB | 2 197 081 | 5/1988 |
| 2004/0066181 A1 | 4/2004 | Thies | | JP | 53-037077 | 4/1978 |
| 2004/0069776 A1 | 4/2004 | Fagrell et al. | | JP | 53-052354 | 5/1978 |
| 2004/0090223 A1 | 5/2004 | Yonezawa | | JP | 55-115383 | 9/1980 |
| 2004/0095145 A1 | 5/2004 | Boudiaf et al. | | JP | 56-007439 | 1/1981 |
| 2004/0095641 A1 | 5/2004 | Russum et al. | | JP | 56-88333 | 7/1981 |
| 2004/0100276 A1 | 5/2004 | Fanton | | JP | 57-075480 | 5/1982 |
| 2004/0100297 A1 | 5/2004 | Tanioka et al. | | JP | 57-163035 | 10/1982 |
| 2004/0108847 A1 | 6/2004 | Stoll et al. | | JP | 62-011243 | 1/1987 |
| 2004/0113639 A1* | 6/2004 | Dunklee et al. ............ 324/754 | | JP | 62-11243 | 1/1987 |
| 2004/0113640 A1 | 6/2004 | Cooper et al. | | JP | 62-51235 | 3/1987 |
| 2004/0130787 A1 | 7/2004 | Thome-Forster et al. | | JP | 62-098634 | 5/1987 |
| 2004/0132222 A1 | 7/2004 | Hembree et al. | | JP | 62-107937 | 5/1987 |
| 2004/0134899 A1 | 7/2004 | Hiramatsu et al. | | JP | 62-239050 | 10/1987 |
| 2004/0147034 A1 | 7/2004 | Gore et al. | | JP | 63-108738 | 5/1988 |
| 2004/0162689 A1 | 8/2004 | Jamneala et al. | | | | |

| | | |
|---|---|---|
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-295167 | 11/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7005078 | 1/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002033374 | 1/2002 |
| JP | 2002/164396 | 6/2002 |
| JP | 2002-164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations in Vector Network Analysis," Jun. 1986, 8 pages.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Design Technique, "Microstrip Microwave Test Fixture," May 1986, 2 pages.
Photo: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Hewlett Packard, "HP 4284A Precision LCR Meter Operation Manual (including Option 001,002,006,201,202, 301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
Temptronic, "Guarded" Chuck Sketch, Nov. 15, 1989.
Andrej Sali, Robert Glaeser, Thomas Earnest & Wolfgang Baumeister, "From words to literature in structural proteomics," Insight: Review Article, Nature 422, pp. 216-225, Mar. 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.
J.D. Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixture," Copyright 1988.
Ronald F. Bauer & Paul Penfield, Jr., "De-Embedding and Unterminating," IEEE Transactions on Microwave Theory and Techniques, vol. MTT-22, No. 3, Mar. 1974, pp. 282-288.
Cross-Section—Signatone S-1240 Sketch, Advertised & Sold 1987-1988.
Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between-196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Mark S. Boguski & Martin W. McIntosh, "Biomedical informatics for proteomics," Insight: review article, Nature 422, Mar. 13, 2003, pp. 233-237.

The Micromanipulator Company, Inc., "Model 8000 Test Station," 1986, 1 page.

The Micromanipulator Company, Inc. "Model 8000 Test Station," 1988, 1 page.

Microwave Products, Microwave Journal, Sep. 1988, 1 page.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," Cascade Microtech, Inc. vs. Micromanipulator Company, Inc., Applebay Exhibit 576, May 13, 1998, 68 pages.

Flexion Corporation, "Cryotest Station MP-3," Cascade Microtech, Inc. vs. Micromanipulator Company, Inc., Applebay Exhibit 578, May 13, 1998, 1 page.

Cascade Microtech, Inc. vs. Micromanipulator Company, Inc., Applebay Exhibit 572, May 13, 1998, 2 pages.

Cascade Microtech, Inc. vs. Micromanipulator Company, Inc., Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

Cascade Microtech, Inc. vs. Micromanipulator Company, Inc., Applebay Exhibits 577A, 577B, 577C, May 13, 1998, 3 pages.

Cascade Microtech, Inc. vs. Microwanipulator Company, Inc., Applebay Exhibit 585, May 13, 1998, 7 pages.

Mark S. Boguski and Martin W. McIntosh, "Biomedical Informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "Insight review articles, Disease proteomics," Nature, vol. 422, Mar. 13, 2003, pp. 226-232.

Mike Tyers and Matthias Mann, "Insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "Insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qunqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christopher Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafter DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1988, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Krazsewski, Stuart O. Nelson, and Tian-Su You, "Use of a Microwave Cavity for Sensing Dielectric Properties of Arbitrarilly Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

PROBE STATION WITH TWO PLATENS

BACKGROUND OF THE INVENTION

This application is a continuation of U.S. patent application Ser. No. 10/285,135 filed Oct. 30, 2002, now U.S. Pat. No. 6,777,964 which claims the benefit of U.S. Provisional Patent Application Ser. No. 60/351,844 filed Jan. 25, 2002.

The present invention relates to a probe station.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck, that heats or cools the electrical device being tested through thermal conduction.

Many probe stations also incorporate guarding and electromagnetic interference (EMI) shielding structures within or around the environmental enclosures in order to provide an electrically quiet environment, often essential during high frequency testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in *Evaluation Engineering*, November, 1990, pages 150-153.

Probe stations incorporating EMI shielding structures will usually at least partially surround the test signal with a guard signal that closely approximates the test signal, thus inhibiting electromagnetic current leakage from the test signal path to its immediately surrounding environment. Similarly, EMI shielding structures may provide a shield signal to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multi-stage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below.

FIG. 1 shows a generalized schematic of a probe station 10. The probe station 10 includes the chuck 12 that supports the electrical device 14 to be probed by the probe apparatus 16 that extends through an opening in the platen 18. An outer shield box 24 provides sufficient space for the chuck 12 to be moved laterally by a positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. The sliding plate assembly 28 is included to permit lateral movement of the positioner 22, and hence the chuck 12, while maintaining a substantially closed lower perimeter for the shield box 24.

Referring to FIG. 2, in many cases the semiconductor wafers that are tested within such a probe station are edge coupled photonics devices. Edge coupled photonics devices are normally arranged within each semiconductor wafer in orthogonal arrays of devices. Typically, the wafers are sliced in thin strips of a plurality individual optical devices, as illustrated in FIG. 3. Edge coupled photonics devices may include, for example, lasers, semiconductor optical amplifiers, optical modulators (e.g., Machzhender, electro-absorption), edge coupled photo-diodes, and passive devices. Referring to FIG. 4, many such photonics devices provide light output through one side of the device. Normally, the photonics devices receive light through the opposing side of the device from the light output. On another side of the device one or more electrical contacts are provided. In typical operation, the light provided by the device may be modulated or otherwise modified by changing the input light and/or the electrical signal to the device, or the electrical output may be modulated or otherwise modified by changing the input light. Similarly, other photonics devices are surface coupled where the electrical contact and the light output (or light input) are both on the same face of the device, as illustrated in FIG. 5. On such surface coupled photonics device is a VCSEL laser.

Referring to FIG. 6, a typical arrangement to test such photonics devices within a probe station is shown. A set of electrical probe positioners 50 are arranged on the platen to provide electrical signals to and from the device under test, as needed. In addition, one or more optical probe positioners 60 are positioned on the platen to sense the light output from the device under test or provide light to the device under test. As it may be observed, when testing devices that include both optical and electrical attributes the number of positioners may be significant thereby potentially resulting in insufficient space on the platen to effectively accommodate all the necessary positioners. In addition, the opening provided by the platen is normally relatively small so that the space available for extending the probes through the platen is limited. This limited space significantly increases the difficultly in positioning the electrical and optical probes. Similarly, the end of the optical probes typically need to be positioned within 0.10 microns in x/y/z directions which is somewhat awkward from a position on the platen above the chuck. Moreover, the angular orientation of the end portion of the optical probe likewise needs to be very accurate to couple light between the optical probe and the device under test which is similarly difficult. In many applications extreme positional and angular accuracy is needed to couple the optical waveguide or free space optical path (i.e., optical probe) to a photonics device or another optical waveguide. Moreover, during the testing of wafers the optical probes frequently tend to be out of alignment requiring manual alignment for each photonics device while probing each of the devices.

What is desired, then, is a probe station that facilitates accurate alignment of electrical and optical probes.

DETAILED DESCRIPTION OF THE PREFERRED EMBODIMENT

During testing, the end of the optical probes are typically aligned with the edge of the device under test while the electrical probes are typically aligned with the contacts on the upper surface of the device under test, with both the electrical probes and the optical probes being supported by the platen. In many cases, the entire platen is moved in the z-axis direction for selectively contacting the electrical probes on the device under test. Alternatively, the chuck is moved in a z-axis direction. The z-axis movement of the platen permits consistent simultaneous relative movement of all the electrical and optical probes. Each component of the device under test is successively moved in x and/or y lateral directions relative to the electrical probes using a chuck or other support to a location under the electrical probes.

The present inventors considered the z-axis movement of the platen or chuck to perform simultaneous probing and came to the realization that normal z-axis movement of the platen typically brings the probes into contact with the device under test with sufficient additional z-axis movement to result in lateral scrubbing of the contact surfaces to provide a good contact. This additional z-axis movement for the electrical probes, which may vary depending on the particular circuit being probed, different electronic components, the planarity of the devices, and differences in the height of the different contacts between devices, may result in inaccurate alignment of the optical probes which are likewise being moved in the z-axis direction together with the platen or chuck. The alignment of the optical inputs and outputs of the devices tends not to vary in the same manner as the contacts, if they vary significantly at all. In summary, the appropriate z-axis movement of the electrical probes varies depending on the particular device being tested; while the appropriate z-axis movement of the optical probes tends to be at a substantially fixed location with respect to the device under test, which may not be consistent with the z-axis movement provided for the electrical probes. Moreover, the relatively long optical device tends to expand and contract with temperature variations of the environment resulting in additional difficultly properly positioning the optical probe.

Figure 1:
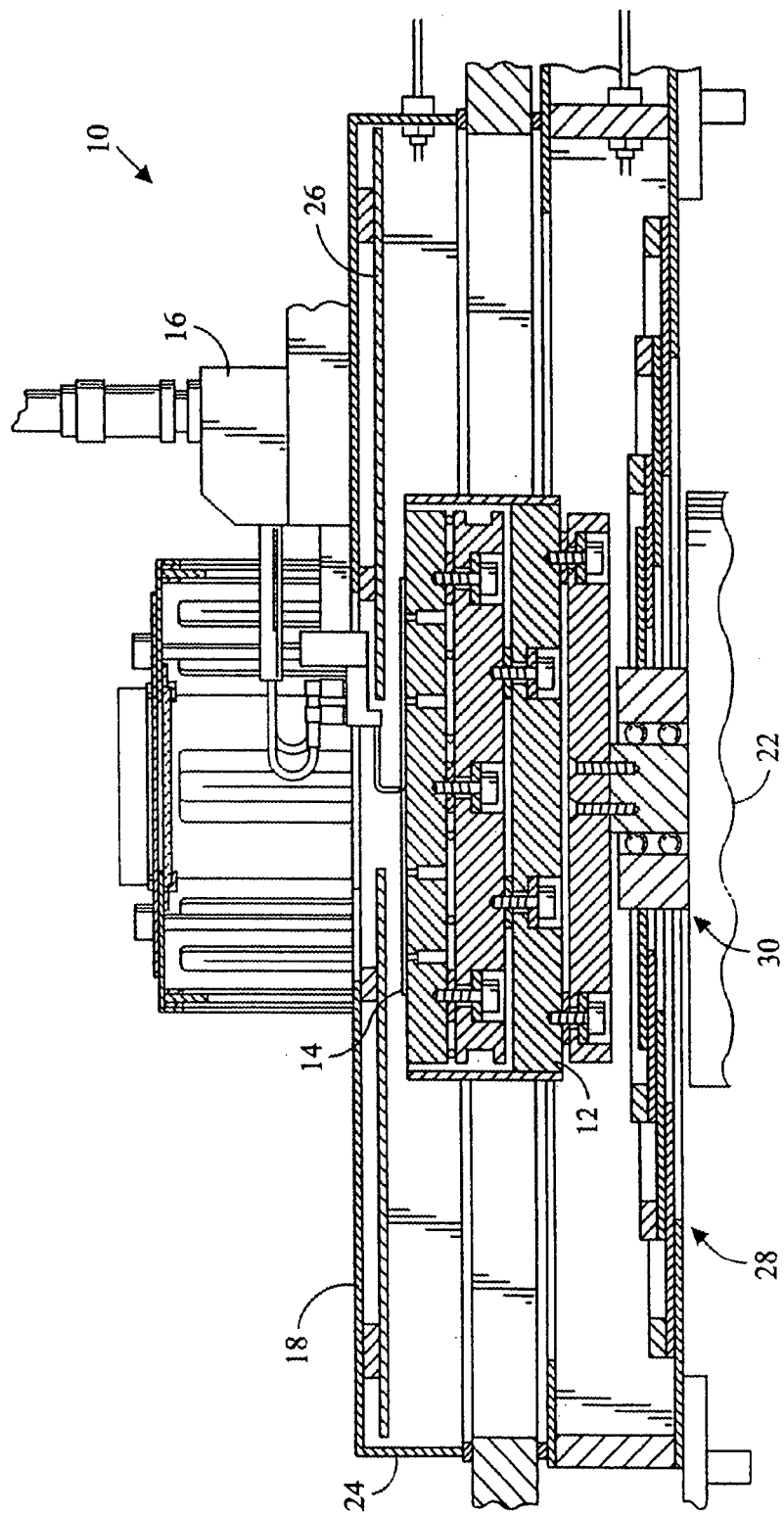
FIG. 1 shows a cross sectional view of an existing probe station.
Figure 2:
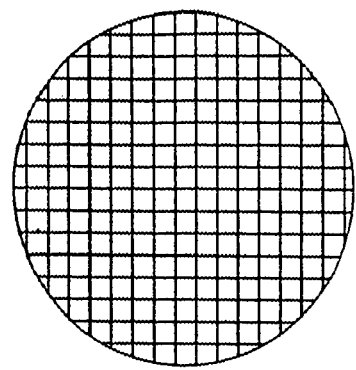
FIG. 2 illustrates a wafer with photonics devices thereon.
Figure 3:
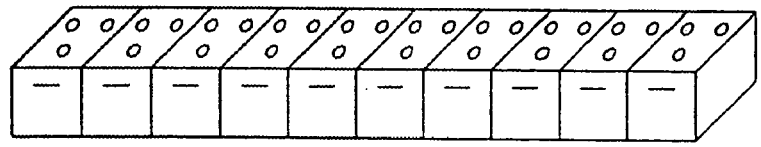
FIG. 3 illustrates a strip of photonics devices.
Figure 4:
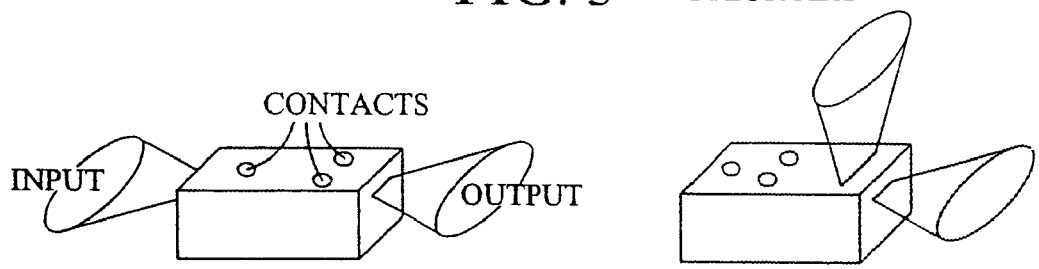
FIG. 4 illustrates an edge coupled photonics device.
Figure 5:
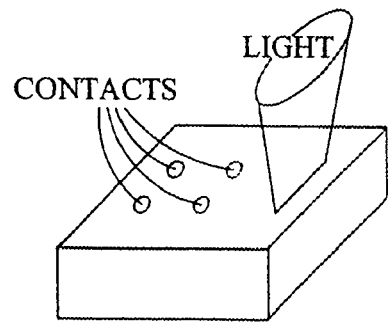
FIG. 5 illustrates an upper surface coupled photonics device.
Figure 6:
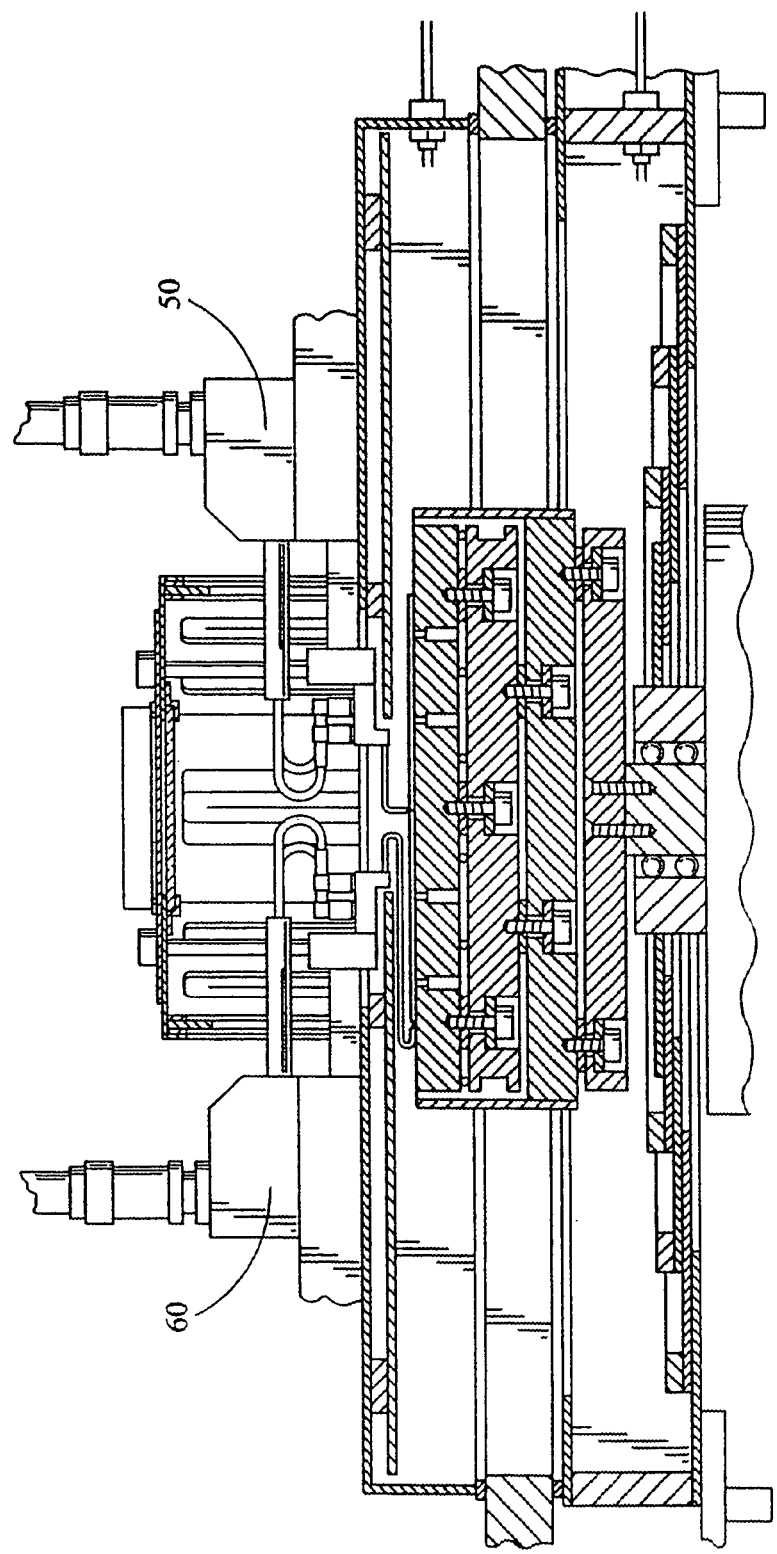
FIG. 6 shows a cross sectional view of the probe station of FIG. 1 with electrical and optical probes.
Figure 7:
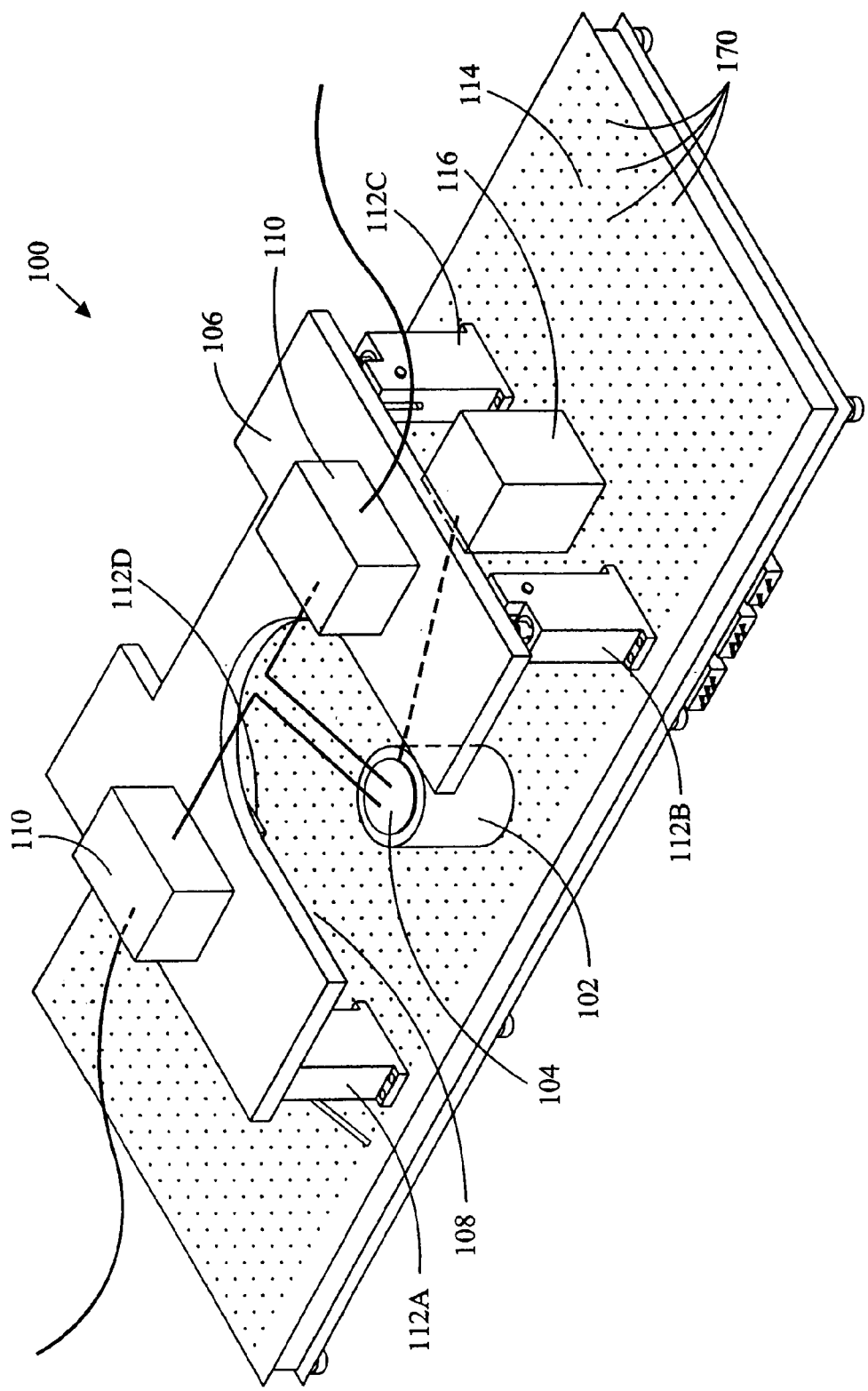
FIG. 7 shows a pictorial view of a modified probe station.

In light of the foregoing realizations the present inventors determined that the traditional probe station should be modified in some manner to facilitate at least partial independent movement or otherwise separation of the optical probes and electrical probes. Referring to FIG. 7, a modified probe station 100 includes a chuck 102 that supports a device under test 104. The device under test 104 in many instances is one or more photonic devices. An upper platen 106 defines an opening 108 therein and is positioned above the chuck 102. The opening 108 may be, for example, completely encircled by the upper platen 106 or a cutout portion of the upper platen 106. Electrical probes 110 are supported by the upper platen 106. The platen 106 is supported by a plurality of supports 112A, 112B, 112C, and 112D. Positioned below the supports 112A-112D is a lower platen 114. The optical probes 116 are supported by the lower platen 114. A microscope, not shown, may be used to position the device under test 104 relative to the probes 110 and 116. During probing the upper platen 106 is moved in a z-axis direction to make contact between the electrical probes 110 and the device under test 104. The x and/or y position of the chuck 102 (hence the device under test 104) relative to the electrical probes 110 is modified, and thereafter the upper platen 106 is moved in a z-direction to make contact between the electrical probes 110 and the device under test 104. During testing the optical probes 116 are aligned with the edge of the device under test 104.

In the case that the device under test is moved in a direction perpendicular to the edge of the device under test 104 being tested, it may be observed that the optical probes 116 may not need to be repositioned for each device being tested. If realignment of the optical probes 116 are necessary, there is a good likelihood that minimal adjustment is necessary. In particular, there is a high likelihood that the elevation of the optical probe 116 is accurate (or nearly so) because the chuck 102 is moving within a horizontal plane for testing the device under test 104. It may be observed that optical probes 116 are effectively decoupled from the z-axis motion of the upper platen 106. Moreover movement of the upper platen 106 for bringing the electrical probes 110 into contact with the device under test 104 does not result in movement of the optical probe 116 with respect to the device under test 104. Similarly, it may be observed that movement of the optical probes 1 16 does not result in movement of the electrical probes 110.

As illustrated in FIG. 7, it may be observed that there is substantial open space on the lower platen 114 to position the optical probes 116. Further, the open space permits operators to access the optical probes 116 to make adjustments, as necessary. For example, the lower platen 114 may include at least 70% of its surface area free of other components and structures, such as the chuck and supports, available for the positioning of optical components thereon. More preferably, at least 80%, 85%, 90%, and 95% of the surface area of the lower platen 114 is free of other components and structures. Moreover, from a region defined by the perimeter of the supports, the lower platen 114 has preferably 70%, 80%, 85%, 90%, or 95% of the surface area of the upper platen free from other components and structures thereon in any outward direction, such as +x, −x, +y, or −y directions. This free space more readily permits the attachment of free space optics thereon, which frequently require substantial space and flexibility to set up. The size of the upper platen 106 may have less surface area, the same surface area, or greater surface area than the lower platen 114. For example, the lower platen 114 (e.g., optical platen) may have a surface area that is 25%, 35%, or 50% or more greater than the upper platen 106 (e.g., non-optical platen). This increased surface area of the lower platen 114 relative to the upper platen 106 permits more open access to the lower platen 114 to locate optical components thereon without limitations resulting from the proximity upper platen 106. Preferably the lower platen 114 is a single integral member or otherwise a rigidly interconnected set of members. It is of course to be understood that the system may include more than two platens, as desired. In addition, the electrical components may be located on the lower platen, as desired. Also, the optical components may be located on the upper platen, as desired, which may include holes therein for an optical breadboard if desired. Furthermore, with the upper platen being maintained in position principally by gravity, such that it would become detached from the supports if the probe station were turned up side down, a set of different upper platens may be provided, each of which is designed to be particularly suitable for a particular test. For example, some upper platens may be small, large, oval, rectangular, thin, thick, etc.

Another feature that may be included is the capability of removing or otherwise moving the upper platen out of the way for in a controlled manner. The movement of the upper platen facilitates the adjustment and installation of the optical components thereunder. For example, a mechanical support mechanism may be included that supports the upper platen while the platen is moved with respect to the remainder of the probe station, and in particular the lower platen. For example, the upper platen may be displaced such that at least 20% (or at least 30% or at least 40% or at least 50%) of its surface area is laterally displaced beyond its original position on the supports. Alternatively, the upper platen may be tilted upwardly. For example, the upper platen may be tilted such that it is at least 5 degrees (or at least 10 degrees or at least 20 degrees or at least 45 degrees or at least 75 degrees) of its surface area is tiled with respect to its position when probing, such as horizontal.

Figure 8:
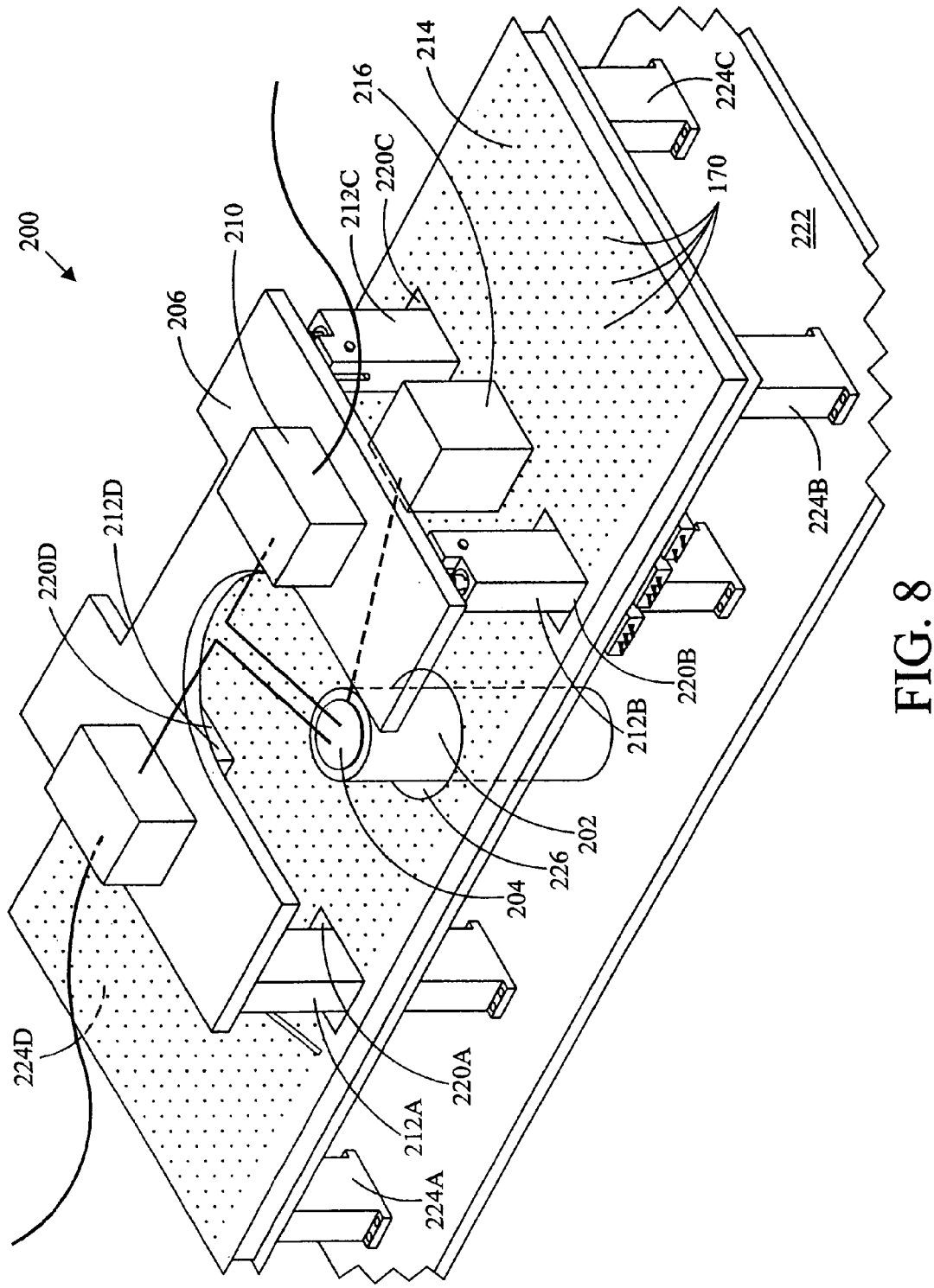
FIG. 8 shows a pictorial view of another modified probe station.

Referring to FIG. 8, a modified probe station 200 includes an upper platen 206 supported by a set of upper supports 212A-212D. The upper supports 212A-212D extend through respective openings 220A-220D in a lower platen 214 and are supported by a base 222. The lower platen 214 is supported by a set of supports 224A-224D which is supported by the base 222. The supports 224A-224D and the supports 212A-212D are preferably adjustable in height. The chuck 202 extends through an opening 226 in the lower platen 214 and is supported by the base 222. With this structure, one or more optical probes 216 supported by the lower platen 214 may be simultaneously moved in the z-axis direction with respect to a device under test 204 supported by the chuck 202. Also, one or more electrical probes 210 may be simultaneously moved in the z-axis direction with respect to a device under test 204 supported by the chuck 202. Furthermore, one or more electrical probes 210 may be simultaneously moved in the z-axis direction with respect to the optical probes 216, or vise versa, both of which may be moved relative to the device under test 204. This permits effective realignment of one or more optical probes 216 with respect to the edge of the device under test 204. In this manner, at least a portion of the alignment of the optical probes 216 may be performed by the probe station, as opposed to the individual positioners attached to the optical probes 116. It is to be understood that the lower platen 214 is preferably positioned at a location below the device under test 204 while the upper platen 206 is positioned above the device under test 204. Also, it is to be understood that the lower platen 214 may be positioned at a location above the device under test 204 while the upper platen 206 is likewise positioned above the device under test 204. Also, it is to be understood that the lower platen 214 may be positioned at a location below the device under test 204 while the upper platen 206 is likewise positioned below the device under test 204. Moreover, the range of movement of the supports may permit the upper platen 206 and/or the lower platen 214 to be moved from a position above the device under test 214 to a position below the device under test 214, or from a position below the device under test 214 to a position above the device under test 214.

Figure 9:
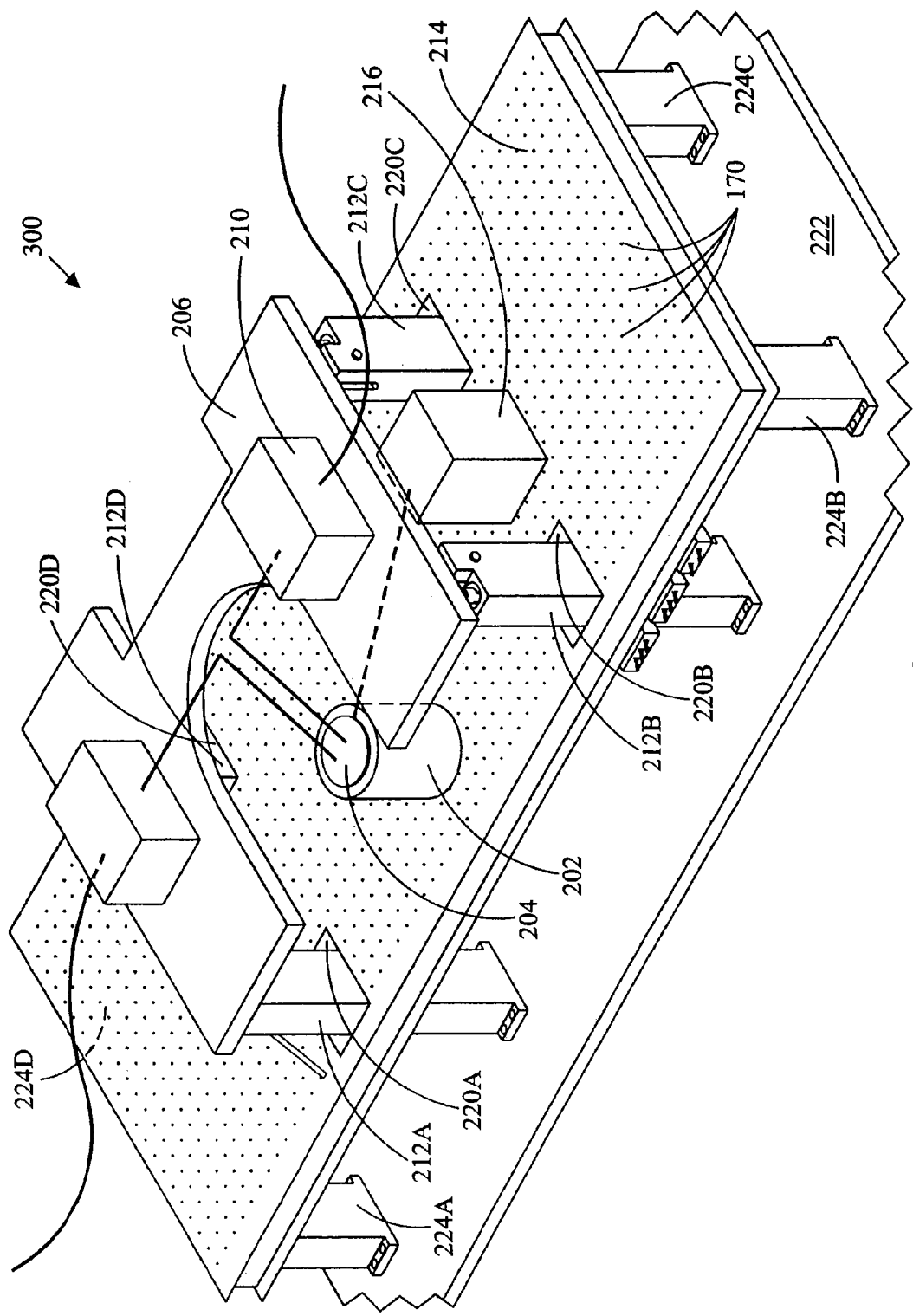
FIG. 9 shows a pictorial view of yet another modified probe station.

Referring to FIG. 9, a modified probe station 300 includes the chuck 202 being supported by the lower platen 214. In this manner, the chuck 202 and the lower platen 214 will move together in the z-axis. This is beneficial, at least in part, to assist in maintaining the relative alignment between the optical probes and the device under test.

Referring to FIGS. 7-9, the lower platen (or the upper platen) may include a set of openings 170 defined therein suitable for engaging an optical device. Typically the openings 170 are arranged in an orthogonal array. The openings 170 provide a convenient mechanism for interconnection between the lower platen and the optical probes.

The probe station facilitates the testing of a photonics device that includes an optical test path, which is optimized based upon optical characteristics. In addition, the probe station facilitates the testing of a photonics device that includes an electrical test path, which is similarly optimized based upon electrical characteristics. Typically multiple electrical probes are supported and simultaneously brought into contact with the device under test. In this manner, the probe station includes a structure that brings together optimized electrical test paths and optimized optical test paths together on the device under test.

Figure 10:
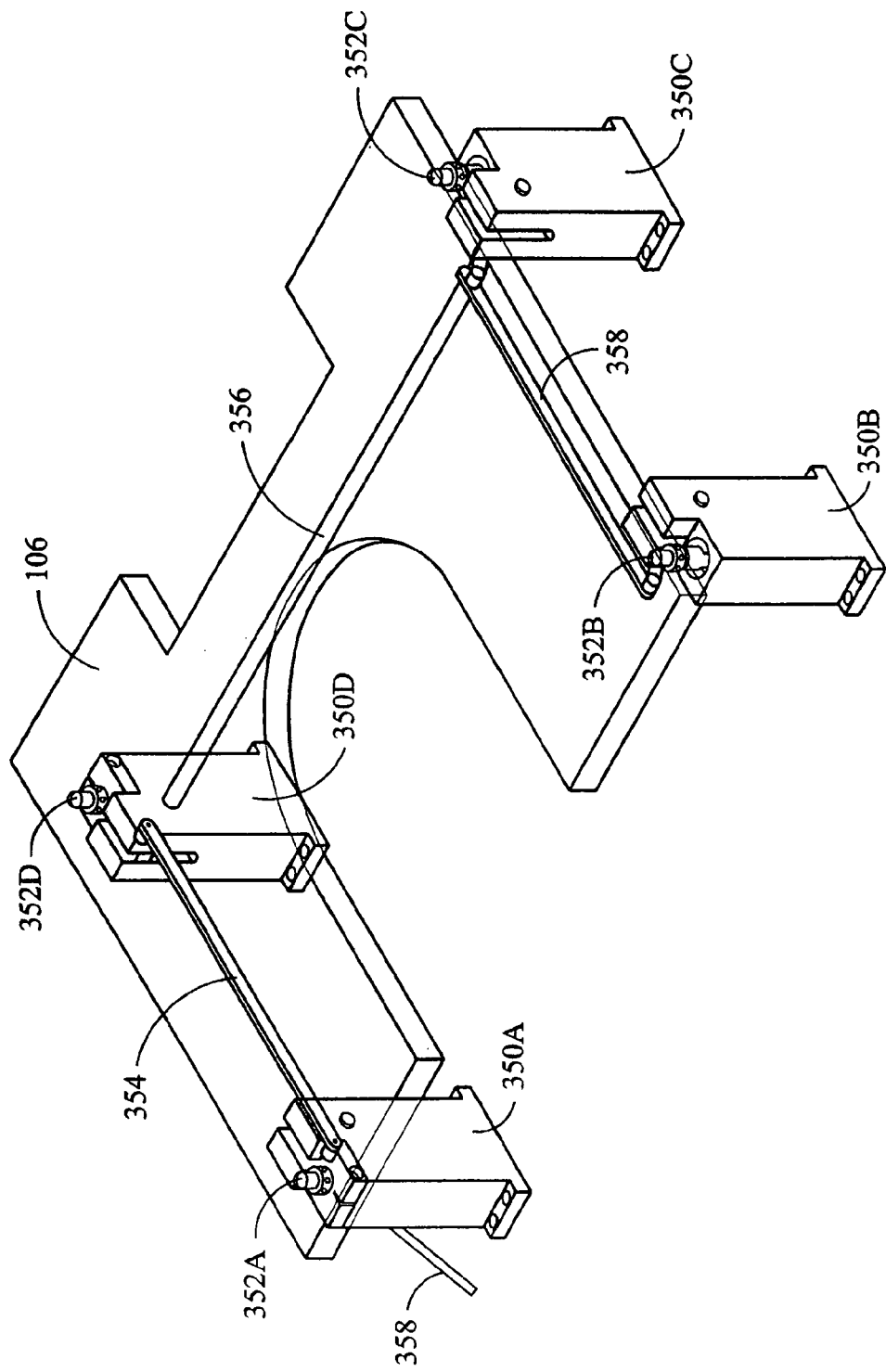
FIG. 10 shows a pictorial view of the support assembly for the probe station of FIG. 7.

Referring to FIG. 10, the upper platen 106 (or other platens) is supported by a plurality of supports 350A-350D. Preferably the platen 106 is supported by a set of contacts 352A-352D. The contacts 352A-352D are preferably not fixedly interconnected with the upper platen 106, but rather maintained in contact by the force of gravity free from a fixed interconnection, such as a screw or bolt. Accordingly, the upper platen 106 may be removed from the supports 350A-350D by merely lifting the upper platen 106. A set of interconnecting members 354, 356, and 358 may be included to provide increased rigidity to the supports 350A-350D. In addition, the length of the interconnecting members 354, 356, 358 may be adjustable, such as extending through the supports 350A-350D or otherwise including a length adjustment mechanism for the interconnecting members themselves. In this manner the upper platen 106 may be lifted from the supports 350A-350D , the position of the supports 350A-350D and relative spacing thereof modified, and the upper platen 106 repositioned on the supports 350A-350D. In addition, a mechanical lift mechanism 359 may be included to raise and lower the upper platen 106. Also, the supports 350A-350D may include internal height adjustment for z-axis movement. Further, computer controlled lift control mechanisms may likewise be used. Moreover, it may be observed that the upper platen 106 may be moved in the z-axis direction, and in the x and/or y direction by simply moving the upper platen 106. In an alternative embodiment, the supports 350A-350D may include horizontal movement structures to move the upper platen 106 in the x and/or y directions. As one example, the horizontal movement structures may be a set of rollers that permit the selective lateral movement of the upper platen 106.

Figure 11:
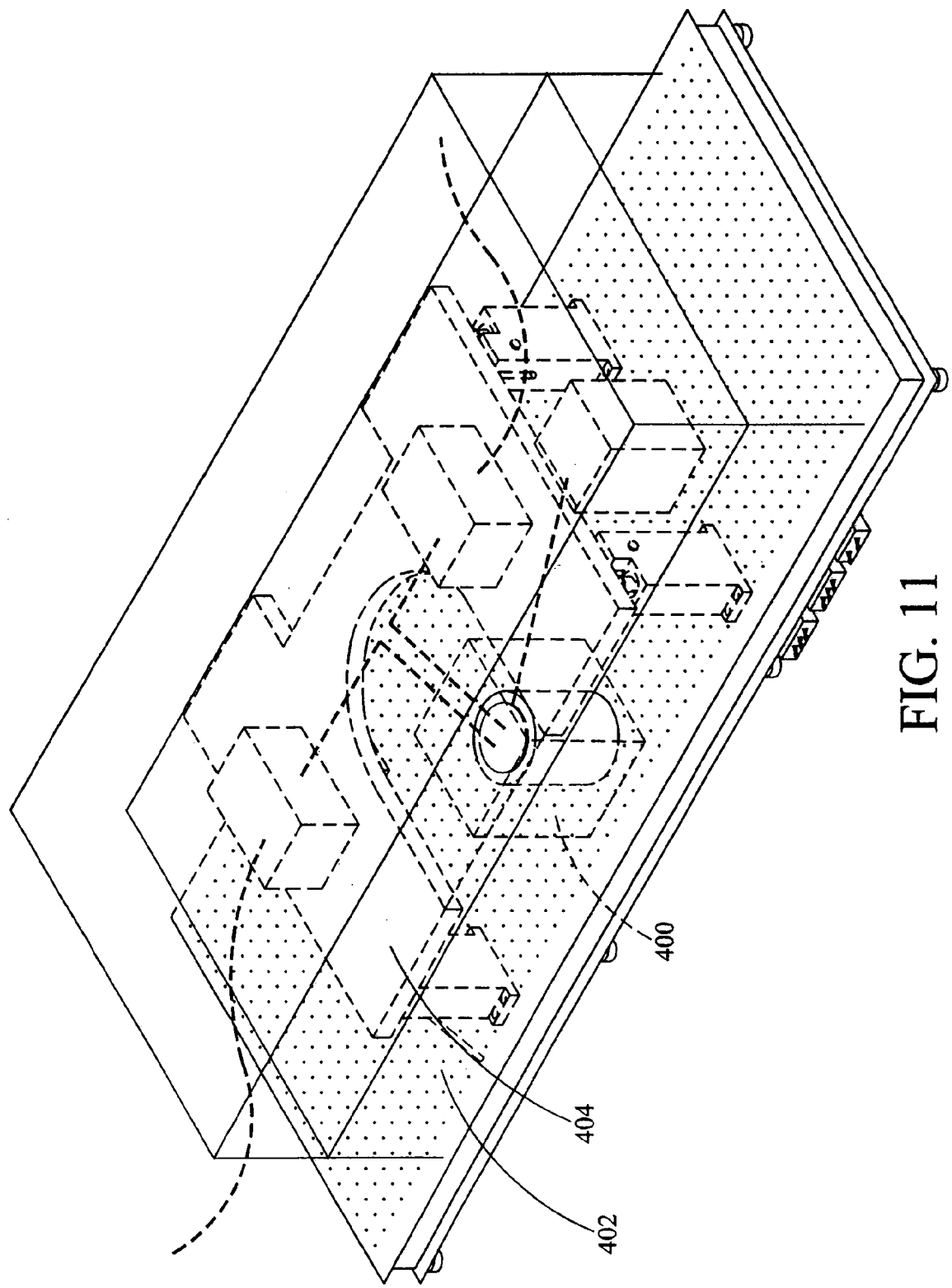
FIG. 11 shows a pictorial view of a further modified probe station.

Referring to FIG. 11, a substantially enclosed environment 400 may be provided around the device under test. The environment may be electrically connected to an earth ground potential, an instrument ground potential, a guard potential, a shield potential, or otherwise remains floating. An optical box 402 may be provided within the lower region of the probe station to provide a substantially light tight environment around the device under test, which may be useful for many applications. The optical box 402 preferably includes a plurality of sealable openings to permit access to the optical probes. An electrical box 404 may be provided within the upper region of the probe station to provide a substantially noise controlled environment around the electrical probes, which may be useful for many applications. The electrical box 404 may be electrically connected to an earth ground potential, an instrument ground potential, a guard potential, a shield potential, or otherwise remains floating.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A probe station for testing a device under test, said probe station comprising:
    (a) a first platen supporting an electrical probe engageable with a first surface of said device under test;
    (b) a chuck supporting said device under test;
    (c) a second platen having a top surface supporting thereon an optical probe to emit light for impingement on said device under test and, alternatively, to detect light emitted by said device under test toward said first platen and propagating on an axis not substantially normal to said first surface;
    (d) said first platen positioned above said second platen and above said device under test;
    (e) at least 70% of the top surface of said second platen terminating in free space when said optical probe is not supported thereon.

2. The probe station of claim 1 wherein at least 80% of the top surface of said second platen terminating in free space when said optical probe is not supported thereon.

3. The probe station of claim 1 wherein said first platen is supported for movement relative to said second platen.

4. The probe station of claim 1 wherein at least 85% of the top surface of said second platen terminating in free space when said optical probe is not supported thereon.

5. The probe station of claim 1 wherein at least 90% of the top surface of said second platen terminating in free space when said optical probe is not supported thereon.

6. The probe station of claim 1 wherein at least 95% of the top surface of said second platen terminating in free space when said optical probe is not supported thereon.

7. The probe station of claim 1 wherein said second platen has a greater top surface area than said first platen.

8. The probe station of claim 1 wherein said second platen has a smaller top surface area than said first platen.

9. The probe station of claim 1 wherein said second platen has the same surface area as said first platen.

10. The probe station of claim 1 wherein said first platen is maintained in position with respect to said second platen by gravity such that if said probe station were turned upside down said first platen would freely fall away from said second platen.

* * * * *

UNITED STATES PATENT AND TRADEMARK OFFICE
CERTIFICATE OF CORRECTION

PATENT NO. : 7,368,925 B2  Page 1 of 1
APPLICATION NO. : 10/759481
DATED : May 6, 2008
INVENTOR(S) : Peter Navratil et al.

It is certified that error appears in the above-identified patent and that said Letters Patent is hereby corrected as shown below:

Col. 1, line 8
Change "60/351 ,844" to --60/351,844--.

Col. 2, line 29
Change "plurality individual" to --plurality of individual--.

Col. 4, line 54
Change "probes 1 16 does" to --probes 116 does--.

Col. 5, line 46
Change "is tiled with" to --is tilted with--.

Col. 6, line 61
Change "350A-350D , the" to --350A-350D, the--.

Col. 6, line 64
Change "mechanism 359" to --mechanism 358--.

Signed and Sealed this

Fourth Day of November, 2008

JON W. DUDAS
*Director of the United States Patent and Trademark Office*